US012564062B2

(12) United States Patent
Wesselkamper et al.

(10) Patent No.: US 12,564,062 B2
(45) Date of Patent: Feb. 24, 2026

(54) MULTI-DIE PHYSICALLY UNCLONABLE FUNCTION ENTROPY SOURCE

(71) Applicant: Xilinx, Inc., San Jose, CA (US)

(72) Inventors: James David Wesselkamper, Albuquerque, NM (US); Thomas LeBoeuf, Sandia Park, NM (US); James Bertil Anderson, Madison, AL (US); Jason Moore, Albuquerque, NM (US)

(73) Assignee: XILINX, INC., San Jose, CA (US)

( * ) Notice: Subject to any disclaimer, the term of this patent is extended or adjusted under 35 U.S.C. 154(b) by 359 days.

(21) Appl. No.: 18/207,378

(22) Filed: Jun. 8, 2023

(65) Prior Publication Data

US 2024/0413099 A1     Dec. 12, 2024

(51) Int. Cl.
*H01L 23/00*     (2006.01)
*H01L 23/532*     (2006.01)
*H01L 25/065*     (2023.01)

(52) U.S. Cl.
CPC .......... *H01L 23/576* (2013.01); *H01L 23/573* (2013.01); *H01L 25/0657* (2013.01); *H01L 23/53209* (2013.01); *H01L 2225/06527* (2013.01)

(58) Field of Classification Search
CPC . H01L 23/576; H01L 23/573; H01L 25/0657; H01L 23/53209; H01L 2225/06527; H01L 2225/06541
See application file for complete search history.

(56) References Cited

U.S. PATENT DOCUMENTS

| | | | |
|---|---|---|---|
| 8,981,810 B1 | 3/2015 | Trimberger | |
| 9,082,514 B1 | 7/2015 | Trimberger | |
| 9,225,512 B1 | 12/2015 | Trimberger | |
| 9,444,618 B1 | 9/2016 | Trimberger | |
| 9,584,329 B1 | 2/2017 | Trimberger | |

(Continued)

FOREIGN PATENT DOCUMENTS

EP     3373511 A1 * 9/2018 ............. G06F 21/72

OTHER PUBLICATIONS

Beomsoo Park, et al., "A Metal-Via Resistance based Physically Unclonable Function with Backend Incremental ADC", IEEE Transactions on Circuits and Systems I: Regular Papers, Manuscript submitted Mar. 10, 2021, Department of Electrical and Computer Engineering, University of Florida, Gainesville, FL 32611 USA.

(Continued)

*Primary Examiner* — Mamadou L Diallo
(74) *Attorney, Agent, or Firm* — Patterson + Sheridan, LLP

(57) ABSTRACT

Disclosed circuit arrangements include a physically unclonable function (PUF) entropy source having passive circuit elements and active circuit elements. A first die has one or more metal layers and an active layer, and the passive circuit elements are disposed in the one or more metal layers. A second die has one or more metal layers and an active layer. The active circuit elements are coupled to the passive circuit elements and are disposed in the active layer of the second die, and the first die and the second die are in a stacked structure. The stacked structure has the one or more metal layers of the first die disposed between the active layer of the first die and the active layer of the second die.

20 Claims, 8 Drawing Sheets

(56) References Cited

U.S. PATENT DOCUMENTS

| | | | |
|---|---|---|---|
| 9,608,827 B1 | 3/2017 | Trimberger | |
| 10,027,492 B1 | 7/2018 | Wesselkamper | |
| 10,325,646 B1 | 6/2019 | Trimberger | |
| 2018/0262353 A1* | 9/2018 | Riou | H01L 23/57 |
| 2023/0154893 A1* | 5/2023 | Hiner | H01L 24/96 |
| | | | 257/737 |
| 2023/0187371 A1* | 6/2023 | Parker | H04L 9/3278 |
| | | | 438/401 |
| 2024/0405519 A1* | 12/2024 | Clarke | H10D 89/911 |

OTHER PUBLICATIONS

Qianying Tang, et al., "A Physical Unclonable Function based on Capacitor Mismatch in a Charge-Redistribution SAR-ADC", Dept. of Electrical and Computer Engineering, University of Minnesota, Minneapolis, MN, USA, and Western Digital Research, CA, USA. Downloaded Dec. 6, 2022.

G. Edward Suh, et al., "Physical Unclonable Functions for Device Authentication and Secret Key Generation", DAC 2007, Jun. 4-8, 2007, San Diego, California, USA, Copyright 2007 ACM.

Rainer Falk, et al., "New Applications of Physical Unclonable Functions", International Journal on Advances in Security, vol. 9 No. 1 & 2, year 2016, http://www.iariajournals.org/security/, 2016, © Copyright by authors, Published under agreement with IARIA—www.iaria.org.

Nathan Menhorn, "External Secure Storage Using the PUF", Xilinx, XAPP1333 (v1.0) Jun. 26, 2018. www.xilinx.com.

U.S. Appl. No. 18/084,974, filed Dec. 20, 2022, and entitled: Registration of a Puf Signature and Regeneration Using a Trellis Decoder. The Examiner is referred to the copending patent prosecution of the common Applicant (no attachment).

U.S. Appl. No. 17/985,736, filed Nov. 11, 2022, and entitled: Integrated Circuit Protection Using Stacked Dies. The Examiner is referred to the copending patent prosecution of the common Applicant (no attachment).

* cited by examiner

MULTI-DIE PHYSICALLY UNCLONABLE FUNCTION ENTROPY SOURCE

TECHNICAL FIELD

The disclosure generally relates to physically unclonable function (PUF) entropy sources.

BACKGROUND

A system's identity may be established and authenticated based on the unique physical properties of the system. In some applications, physically unclonable functions (PUFs) embodied in integrated circuits (ICs) are used to exploit the unique physical characteristics of a system for purposes of authentication. Each instance of the IC will have slightly different physical characteristics due to the random variation in an IC fabrication process. A PUF circuit uses the physical characteristics to generate an identifier value, for example a binary number, which differs from one integrated circuit to the next due to the different physical characteristics of each manufactured device. These identifier values may be used to uniquely identify the integrated circuit, as a key for encryption and decryption, or for other purposes. Examples of circuits used to implement PUFs include delay circuits and ring oscillators, memory circuits, and cross-coupled latches. The terms PUF circuit and PUF may be used interchangeably herein.

Security for IC dice and chip packages has been improving, but many commercial products are still susceptible to a class of physical attacks that use backside access to perform laser attacks, focused ion beam attacks and similar attacks, which require close physical access. Volume protection and package-on-package protections provide limited benefit and provide a relatively low level of security. Recent developments including 7 nm and smaller nodes, which require thinning of the die substrate to access the smallest feature sizes, and active-on-active stacked die present a significant challenge to protecting against the above mentioned physical attacks. In stacked-die packages, signals carrying unencrypted configuration data are often communicated between dice by through-silicon vias (TSVs) and die-to-die interfaces. Deconstruction of the package can expose convenient probe points of a die to attackers.

SUMMARY

A disclosed circuit arrangement includes a physically unclonable function (PUF) entropy source. The PUF entropy source includes first passive circuit elements and first active circuit elements. A first die has one or more metal layers and an active layer, and the first passive circuit elements are disposed in the one or more metal layers. A second die has one or more metal layers and an active layer. The first active circuit elements are coupled to the first passive circuit elements and are disposed in the active layer of the second die. The first die and the second die are in a stacked structure having the one or more metal layers of the first die disposed between the active layer of the first die and the active layer of the second die.

Another disclosed circuit arrangement includes a connection structure and a first die stacked on a first side of the connection structure. The first die has one or more metal layers that include passive circuit elements of a physically unclonable function (PUF) entropy source. A second die is stacked below a second side of the connection structure and has an active layer and active circuit elements of the PUF entropy source coupled to the passive circuit elements through the connection structure.

Other features will be recognized from consideration of the Detailed Description and Claims, which follow.

BRIEF DESCRIPTION OF THE DRAWINGS

Various aspects and features of the circuit arrangements will become apparent upon review of the following detailed description and upon reference to the drawings in which.

DETAILED DESCRIPTION

Figures 1, 2:
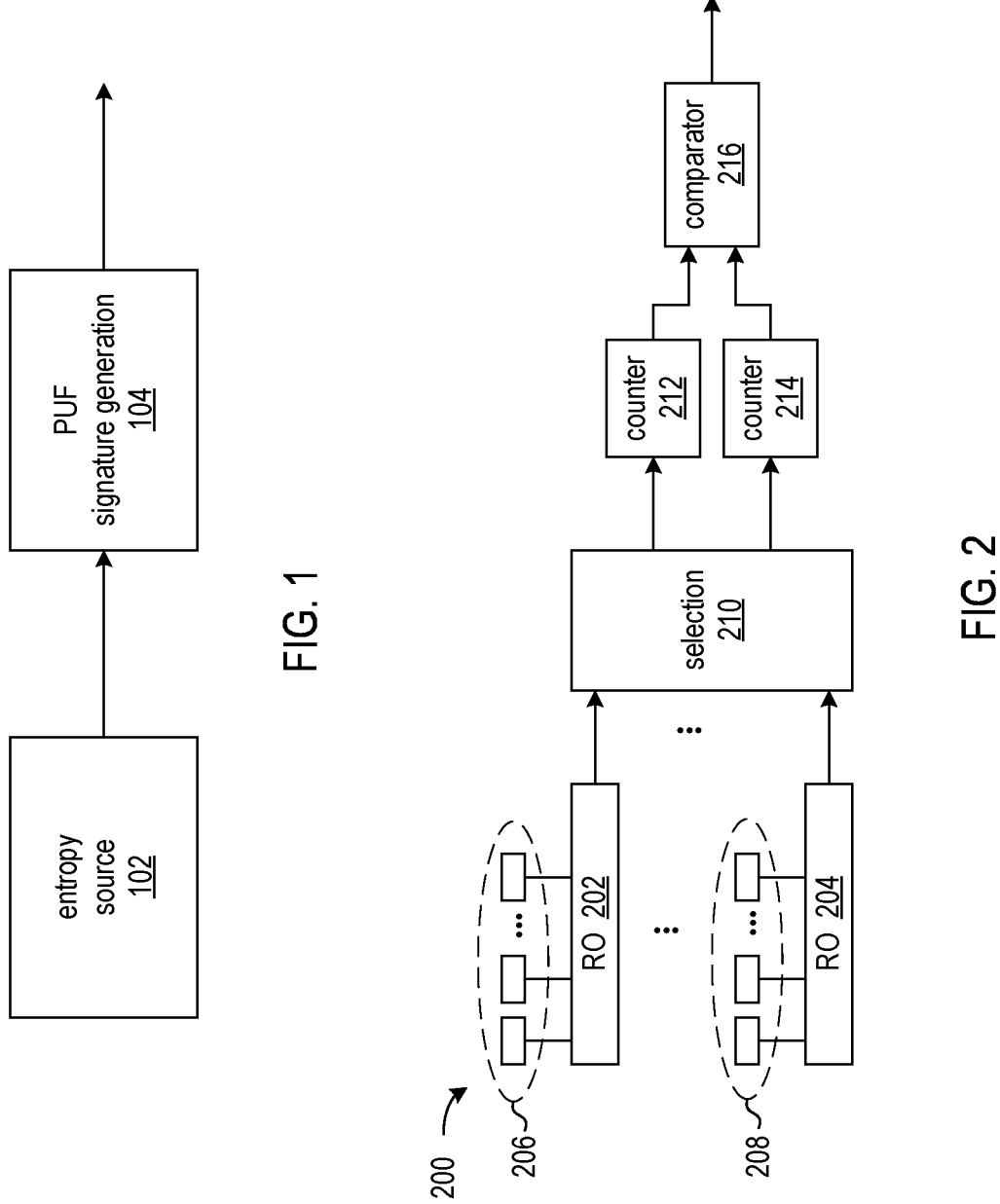
FIG. 1 is a block diagram of circuitry for generating a PUF signature.
FIG. 2 shows an exemplary PUF circuit having an entropy source implemented by ring oscillators.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

According to the disclosed approaches, a PUF entropy source benefits from manufacturing variations in the structures, for example, through-silicon vias (TSVs), that connect stacked IC dice in a package. The circuit arrangements provide a PUF entropy source that cannot be accessed or observed through outside physical means. The disclosed circuit arrangements encase passive circuit elements of the entropy source between the active circuitry of two or more dice in a stacked arrangement of IC dice. In addition, active circuit elements of the entropy source can be encased between the metal layers of the bottom-most die and the active layer of the top-most die, making impossible direct and accurate observation of the active circuit elements of the entropy source.

FIG. 1 is a block diagram of circuitry for generating a PUF signature. The entropy source 102 is a circuit that produces an ordered set or sequence of raw PUF sample values. For example, the value can be 320 differences between pairs of ring oscillators ("ROs"). The raw PUF sample values data are provided to the PUF signature generation circuit 104, which is configured to generate a PUF signature by formatting the values and adding error correction, for example. The PUF signature generation circuit can provide PUF signatures to a key generation circuit (not shown), which may be used for generating secure values or keys.

FIG. 2 shows an exemplary PUF circuit 200 having an entropy source implemented by ring oscillators. The entropy source includes multiple ROs 202, . . . , 204 and groups of passive circuit elements coupled to stages of the ROs. Exemplary passive circuit elements 206 are coupled to the stages of RO 202, and passive circuit elements 208 are coupled to the stages of RO 204. The passive circuit elements can include capacitors, resistors or a combination thereof. The ROs include active circuit elements, such as transistors, and can be implemented at different locations on an IC die or IC package in order to increase entropy.

The selection circuit 210 can include a pair of multiplexers coupled to receive the outputs of each RO, and the two outputs from the selection circuit are coupled to the counter circuits 212 and 214, respectively. The selection of RO output signals can be in response to challenge signals (not shown), which cause the multiplexers to select signals from different ones of the ROs.

The oscillations/cycles of the selected signals occurring over a period of time are counted by counters 212 and 214, respectively, and the counted cycles are compared by comparator 216. The output of the comparator, which is the value of one PUF bit, can depend on which count value is greater. For example, if the count value from counter 212 is greater than the count value from counter 214, a logic one may be output by the comparator. Otherwise, a logic zero is output. Different challenge signals may be successively input to the selection circuit 210 to generate different bits of the PUF value. Alternatively, the RO PUF circuitry may be replicated and bits of the PUF value generated in parallel.

Figure 3:
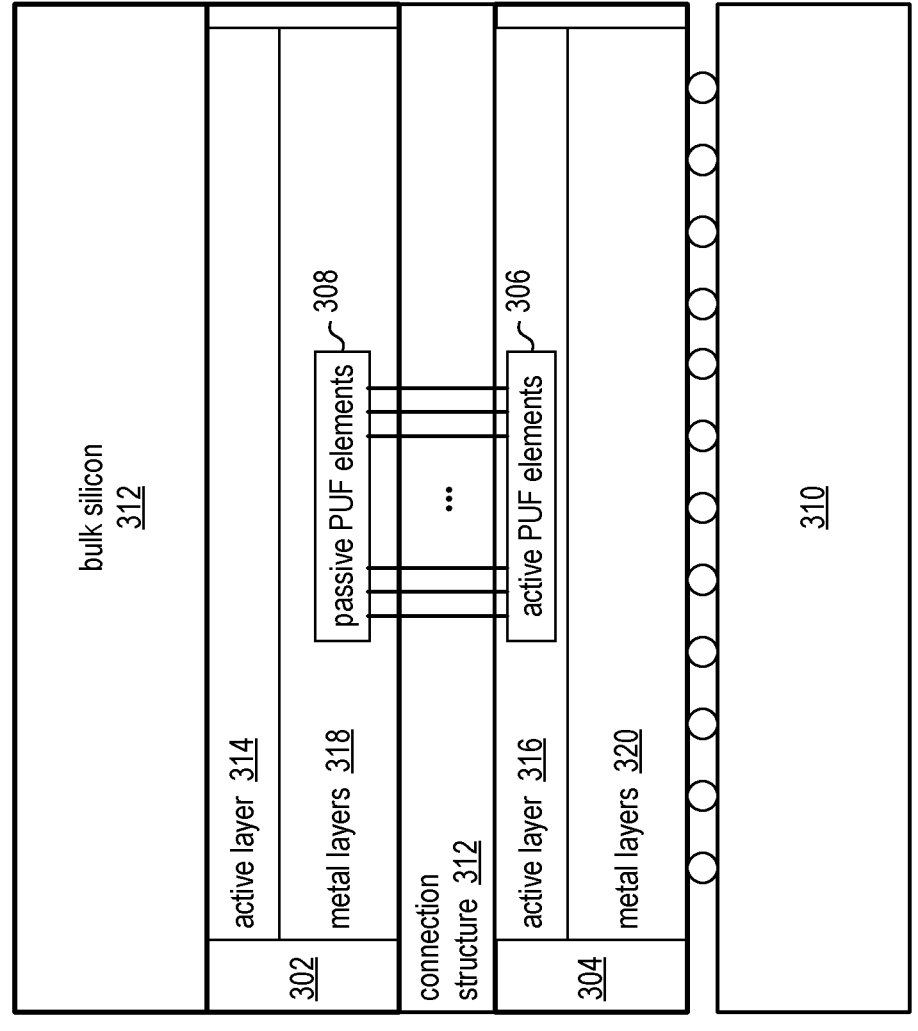
FIG. 3 shows an IC package of two stacked semiconductor dice having active circuit elements and passive circuit elements 308 of a PUF entropy source disposed on the two dice.

FIG. 3 shows an IC package 300 of two stacked semiconductor dice 302 and 304 having active circuit elements 306 and passive circuit elements 308 of a PUF entropy source disposed on the two dice. The exemplary chip package can be disposed on a package substrate 310. A bulk silicon layer 312 provides a physical barrier over the active layer of the top die. The chip package 300 may be mounted to a printed circuit board ("PCB," not shown) to form at least part of an electronic device. The electronic device may be a tablet, computer, copier, digital camera, smart phone, control system, automated teller machine, server or other solid-state memory and/or logic device.

The structure of the PUF entropy source is notably tamper resistant. The passive elements of the PUF entropy source are disposed between the active layers 314 and 316 of dice 302 and 304, respectively. In addition, the active circuit elements 306 of the PUF entropy source are encased between the metal layers 320 of the bottom-most die 304 and the active layer 314 of the top-most die 302, making direct observation of the active circuit elements impossible. Attempts to observe the passive circuit elements would require physical de-processing of the die stack, which would destroy the entropy held in the metal variations of passive circuit elements.

The chip stack is mechanically and electrically coupled to a top surface of the package substrate 310 via solder balls or other suitable connection. The electrical coupling enables data, power and ground signals to be transferred between the circuitry of the dice 302 and 304 and the conductors of the package substrate.

The first IC die 302 generally overlays the second IC die 304 such that within the chip stack, the first IC die is separated from the package substrate 310 by the second IC die 304. There may be one or more additional dice between die 302 die 304, between the package substrate 310 and die 304, or both between die 302 and die 304 and between the package substrate and die 304.

Die 302 is mechanically and electrically coupled to die 304 via a connection structure 312. The connection structure can include multiple solder connections. Alternatively, the connection structure can be a solderless bond between the dice. Examples of solderless bonds include die-to-die, die-to-wafer, wafer-to-wafer bonding, and the like.

The active circuit elements 306 and the passive circuit elements 308 of the PUF entropy source are disposed on the two dice 302 and 304. Each of the dice has an active layer and one or more metal layers. Die 302 has active layer 314, and die 304 has active layer 316. Die 302 has metal layers 318, and die 304 has metal layers 320. The passive circuit elements 308 of the PUF entropy source are disposed in the one or more metal layers 318 of die 302, and the active circuit elements of the PUF entropy source are disposed in the active layer 316 of die 304, which is between the metal layers 318 of die 302 and the metal layers 320 of die 304. The passive circuit elements are coupled to the active circuit elements via the connection structure 312. According to one implementation, the passive circuit elements are metal-oxide-metal, finger capacitors. The metal layers 318 of die 302 are disposed between the active layer 314 of the die 302 and the active layer 316 of die 304.

Figure 4:
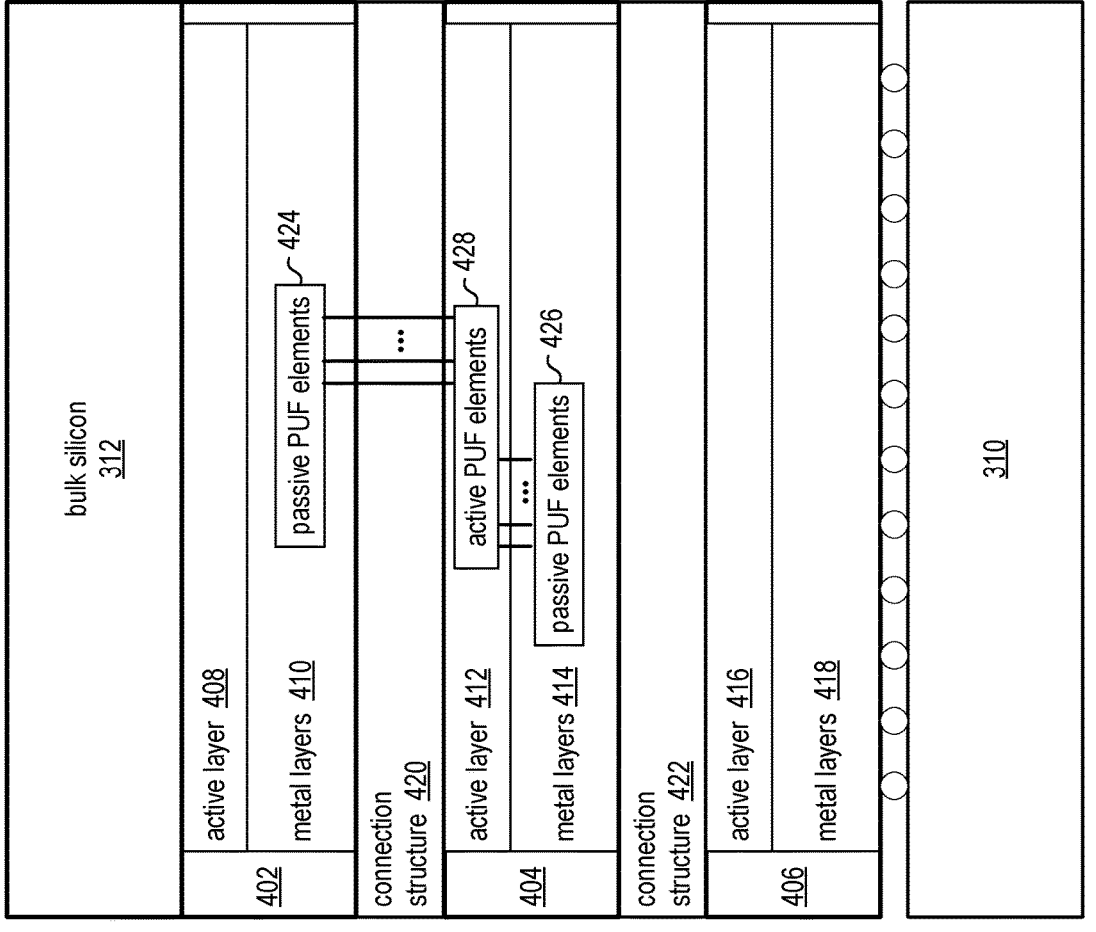
FIG. 4 shows an example of an IC package of stacked semiconductor dice having passive circuit elements of a PUF entropy source disposed on two dice of the package and active circuit elements disposed on one of the dice.

FIG. 4 shows an example of an IC package 400 of stacked semiconductor dice having passive circuit elements of a PUF entropy source disposed on two dice of the package and active circuit elements disposed on one of the dice. The IC package includes dice 402, 404, and 406. Die 402 has active layer 408 and one or more metal layers 410, die 404 has active layer 412 and one or more metal layers 414, and die 406 has active layer 416 and one or more metal layers 418. Connection structures 420 and 422 mechanically and electrically couple the dice in the stacked arrangement.

One subset 424 of the passive circuit elements of the PUF entropy source are disposed in the metal layers 410 of die 402, and another subset 426 of the passive circuit elements are disposed in the metal layers 414 of die 404. The active circuit elements 428 of the PUF entropy source are disposed in the active layer 412 of die 404. The subset 424 of passive circuit elements is coupled to the active circuit elements 428 through connection structure 420, and the subset 426 of passive circuit elements is coupled to the active circuit elements through routing in metal layers 414.

The IC package 400 can include one or more additional dice above or below the dice 402 and 404 in a stacked arrangement. For example, die 406 is below die 404 in the stacked arrangement. Though not shown, one or more additional dice can be stacked above die 402 in a stacked arrangement. The additional dice would be electrically coupled to the dice through additional connection structures and metal layers of the dice.

Figure 5:
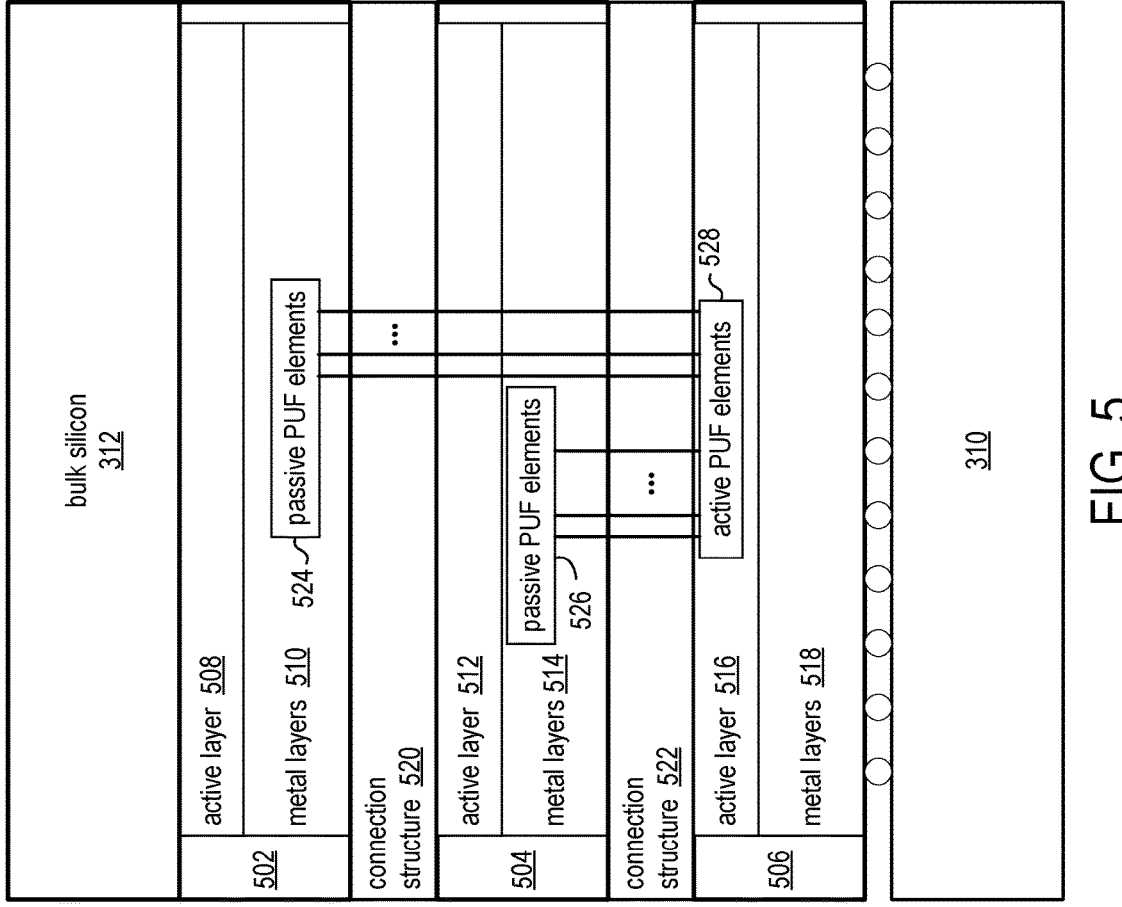
FIG. 5 shows another example of an IC package of stacked semiconductor dice having passive circuit elements of a PUF entropy source disposed on two dice of the package and active circuit elements disposed on one of the dice.

FIG. 5 shows another example of an IC package 500 of stacked semiconductor dice having passive circuit elements of a PUF entropy source disposed on two dice of the package and active circuit elements disposed on one of the dice. The IC package includes dice 502, 504, and 506. Die 502 has active layer 508 and one or more metal layers 510, die 504 has active layer 512 and one or more metal layers 514, and die 506 has active layer 516 and one or more metal layers 518. Connection structures 520 and 522 mechanically and electrically couple the dice in the stacked arrangement.

One subset 524 of the passive circuit elements of the PUF entropy source is disposed in the metal layers 510 of die 502, and another subset 526 of the passive circuit elements is disposed in the metal layers 514 of die 504. The active circuit elements 528 of the PUF entropy source are disposed in the active layer 516 of die 506. The subset 524 of passive circuit elements is coupled to the active circuit elements 528 through connection structure 520, through die 504, and through connection structure 522. The subset 526 of passive circuit elements is coupled to the active circuit elements through connection structure 522. A variation of the IC package 500 can include one or more additional dice in a stacked arrangement above or below dice 502 and 506 and/or between dice 502 and 504 and/or between dice 604 and 606.

Figure 6:
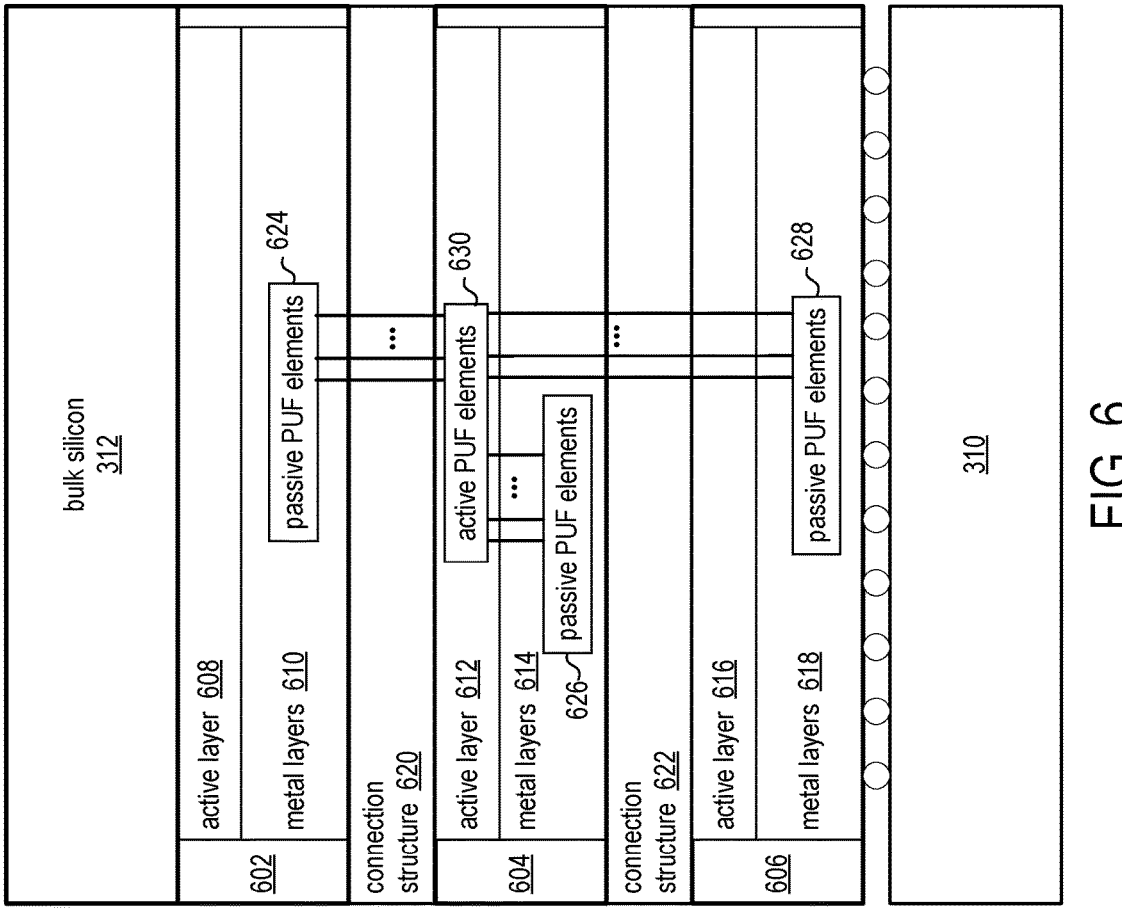
FIG. 6 shows an example of an IC package of stacked semiconductor dice having passive circuit elements of a PUF entropy source disposed on three dice of the package and active circuit elements disposed on one of the dice.

FIG. 6 shows an example of an IC package 600 of stacked semiconductor dice having passive circuit elements of a PUF entropy source disposed on three dice of the package and active circuit elements disposed on one of the dice. The IC package includes dice 602, 604, and 606. Die 602 has active layer 608 and one or more metal layers 610, die 604 has active layer 612 and one or more metal layers 614, and die 606 has active layer 616 and one or more metal layers 618. Connection structures 620 and 622 mechanically and electrically couple the dice in the stacked arrangement.

One subset 624 of the passive circuit elements of the PUF entropy source is disposed in the metal layers 610 of die 602, another subset 626 of the passive circuit elements is disposed in the metal layers 614 of die 604, and another subset 628 of the passive circuit elements is disposed in the metal layers of die 606. The active circuit elements 630 of the PUF entropy source are disposed in the active layer 612 of die 604.

The subset 624 of passive circuit elements is coupled to the active circuit elements 630 through connection structure 620. The subset 626 of passive circuit elements is coupled to the active circuit elements through routing in the metal layers 614. The subset 628 of passive circuit elements is coupled to the active circuit elements through connection structure 622. A variation of the IC package 600 can include one or more additional dice in a stacked arrangement above or below dice 602 and 606 and/or between dice 602 and 604 and/or between dice 604 and 606.

Figure 7:
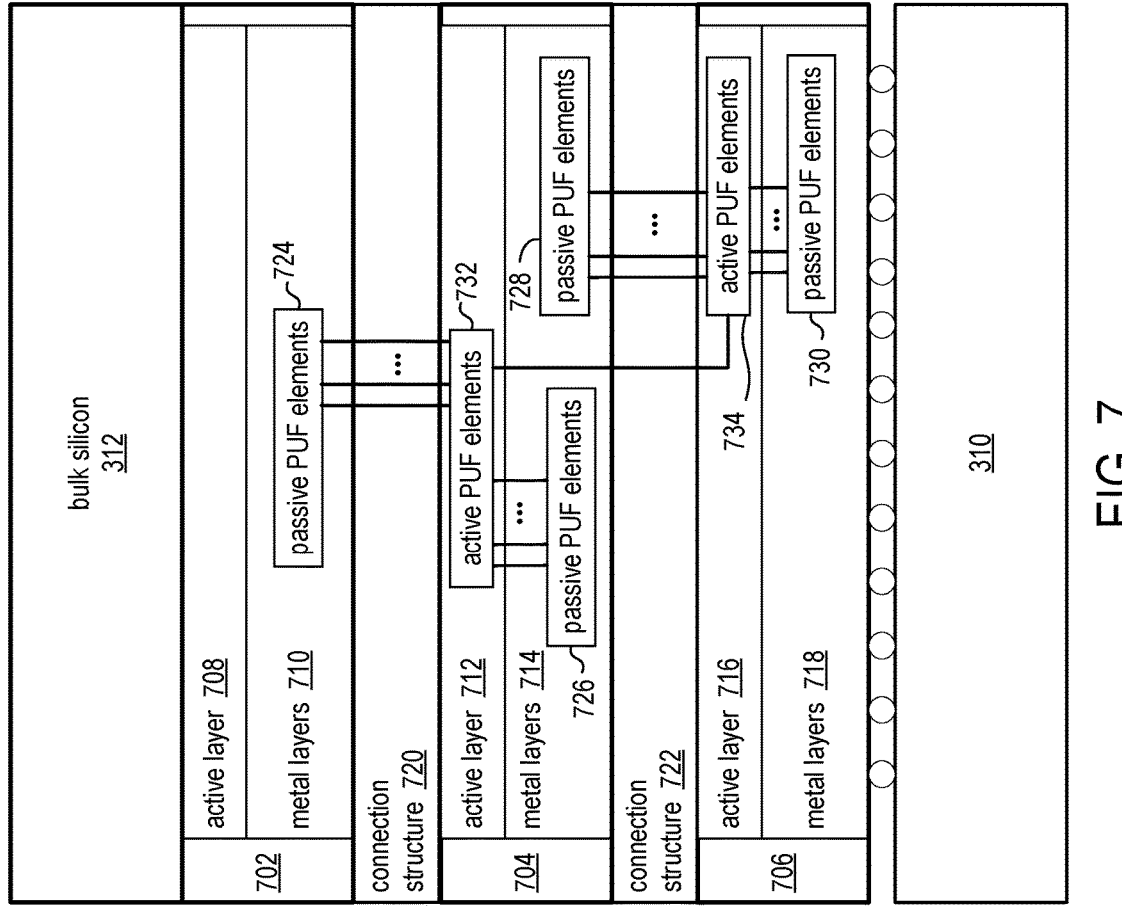
FIG. 7 shows an example of an IC package of stacked semiconductor dice having passive circuit elements of a PUF entropy source disposed on multiple dice of the package and active circuit elements disposed on multiple dice of the package.

FIG. 7 shows an example of an IC package 700 of stacked semiconductor dice having passive circuit elements of a PUF entropy source disposed on multiple dice of the package and active circuit elements disposed on multiple dice of the package. The IC package includes dice 702, 704, and 706. Die 702 has active layer 708 and one or more metal layers 710, die 704 has active layer 712 and one or more metal layers 714, and die 706 has active layer 716 and one or more metal layers 718. Connection structures 720 and 722 mechanically and electrically couple the dice in the stacked arrangement.

One subset 724 of the passive circuit elements of the PUF entropy source is disposed in the metal layers 710 of die 702, another two subset 726 and 728 of the passive circuit elements are disposed in the metal layers 714 of die 704, and another subset 730 of the passive circuit elements is disposed in the metal layers 718 of die 706.

The active circuit elements of the PUF entropy source are coupled in a daisy chain, with one subset 732 of the active circuit elements disposed in the active layer 712 of die 704, and another subset 734 of the active circuit elements disposed in the active layer 716 of die 706. The subset 732 of active circuit elements is coupled to the subset 734 of active circuit elements through the metal layers of die 704 and connection structure 722. In an exemplary PUF entropy source, the stages of one or more ROs of a PUF entropy source can be split across multiple dice. For example, an RO can have stages disposed on separate dice, and/or individual ROs can disposed on separate dice.

The subset 724 of passive circuit elements is coupled to the subset 732 of active circuit elements through connection structure 720. The subset 726 of passive circuit elements is coupled to the subset 732 of active circuit elements through routing in the metal layers 614. The subset 728 of passive circuit elements is coupled to the subset 734 of active circuit elements through connection structure 622. The subset 730 of passive circuit elements is coupled to the subset 734 of active circuit elements through routing in the metal layers 718.

A variation of the IC package 600 can include one or more additional dice in a stacked arrangement above or below dice 702 and 706 and/or between dice 702 and 704 and/or between dice 704 and 706.

Figure 8:
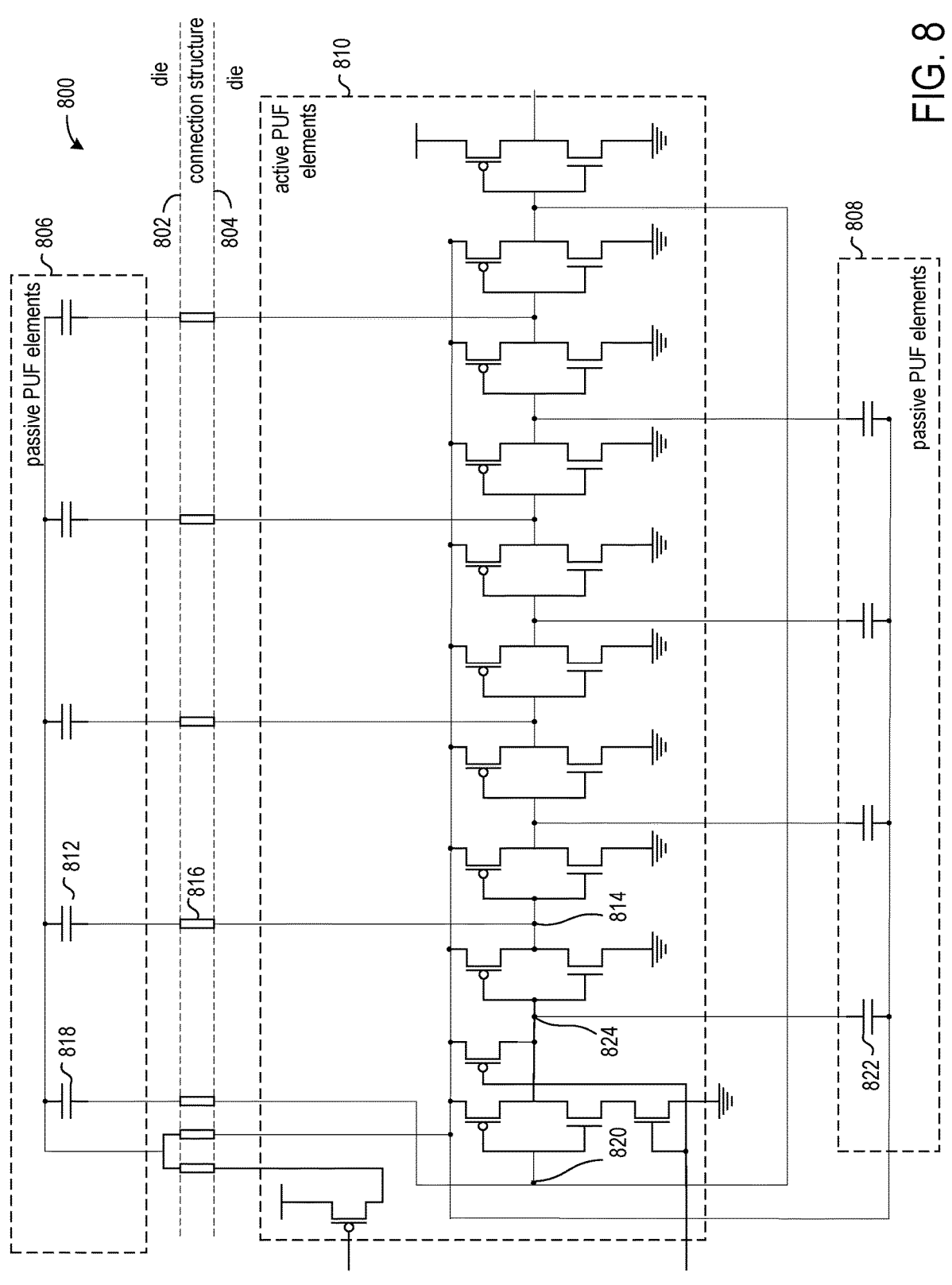
FIG. 8 shows a schematic of an exemplary circuit arrangement that can be used in a PUF entropy source.

FIG. 8 shows a schematic of an exemplary circuit arrangement 800 that can be used in a PUF entropy source. The circuit arrangement includes a ring oscillator and passive circuit elements coupled to nodes between stages. The exemplary RO has 9 stages for ease of illustration. Alternative ROs can have more or fewer stages depending on implementation objectives.

The circuit arrangement occupies two dice, which are demarcated by dashed lines 802 and 804 ("die 802" and "die 804" for ease of reference). One group of passive circuit elements, which is indicated by dashed box 806 ("passive circuit elements 806" for ease of reference) is disposed on die 802, and another group of passive circuit elements, which is indicated by box 808 ("passive circuit elements 808" for ease of reference), is disposed on die 804. According to one implementation, the passive circuit elements are capacitors.

The RO is disposed on die 804, and the active circuit elements of the RO are indicated by dashed box 810. The passive circuit elements 806 and passive circuit elements 808 are coupled to nodes between the stages of the RO. The passive circuit elements 806 can be coupled to the active circuit elements 810 by through-silicon vias (TSVs). For example, capacitor 812 is coupled at node 814 of the RO by way of TSV 816.

The couplings of nodes between successive stages of the RO to the passive circuit elements alternate between capacitors of the two groups. That is, capacitor 818 in group 806 is coupled to node 820 between the last stage and the first stage, capacitor 822 in group 808 is coupled to node 824 between the first and second stages, capacitor 812 in group 806 is coupled to node 814 between the second and third stages and so on.

Figure 9:
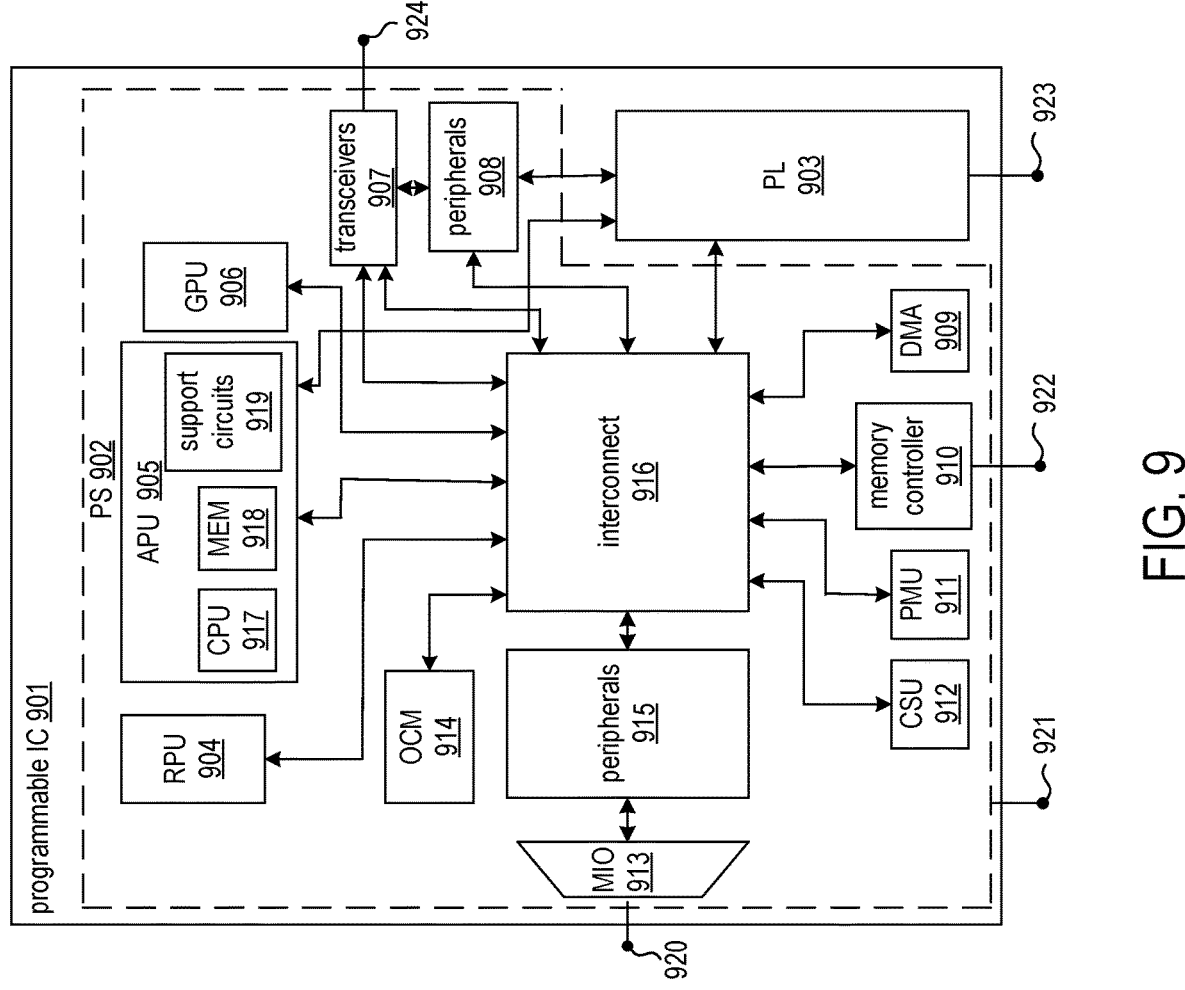
FIG. 9 is a block diagram depicting a system that can be implemented as a package of stacked IC dice according to an example.

FIG. 9 is a block diagram depicting a system 901 that can be implemented as a package of stacked IC dice according to an example. In the example, the SoC includes the processing subsystem (PS) 902 and the programmable logic subsystem 903. The processing subsystem 902 includes various processing units, such as a real-time processing unit (RPU) 904, an application processing unit (APU) 905, a graphics processing unit (GPU) 906, a configuration and security unit (CSU) 912, and a platform management unit (PMU) 911. The PS 902 also includes various support circuits, such as on-chip memory (OCM) 914, transceivers 907, peripherals 908, interconnect 916, DMA circuit 909, memory controller 910, peripherals 915, and multiplexed (MIO) circuit 913. The processing units and the support circuits are interconnected by the interconnect 916. The PL subsystem 903 is also coupled to the interconnect 916. The transceivers 907 are coupled to external pins 924. The PL 903 is coupled to external pins 923. The memory controller 910 is coupled to external pins 922. The MIO 913 is coupled to external pins 920. The PS 902 is generally coupled to external pins 921. The APU 905 can include a CPU 917, memory 918, and support circuits 919. The APU 905 can include other circuitry, including L1 and L2 caches and the like. The RPU 904 can include additional circuitry, such as L1 caches and the like. The interconnect 916 can include cache-coherent interconnect or the like.

Referring to the PS 902, each of the processing units includes one or more central processing units (CPUs) and associated circuits, such as memories, interrupt controllers, direct memory access (DMA) controllers, memory management units (MMUs), floating point units (FPUs), and the like. The interconnect 916 includes various switches, busses, communication links, and the like configured to interconnect the processing units, as well as interconnect the other components in the PS 902 to the processing units.

The OCM 914 includes one or more RAM modules, which can be distributed throughout the PS 902. For example, the OCM 914 can include battery backed RAM (BBRAM), tightly coupled memory (TCM), and the like. The memory controller 910 can include a DRAM interface for accessing external DRAM. The peripherals 908, 915 can include one or more components that provide an interface to the PS 902. For example, the peripherals can include a graphics processing unit (GPU), a display interface (e.g., DisplayPort, high-definition multimedia interface (HDMI) port, etc.), universal serial bus (USB) ports, Ethernet ports, universal asynchronous transceiver (UART) ports, serial peripheral interface (SPI) ports, general purpose (GPIO) ports, serial advanced technology attachment (SATA) ports, PCIe ports, and the like. The peripherals 915 can be coupled to the MIO 913. The peripherals 908 can be coupled to the transceivers 907. The transceivers 907 can include serializer/deserializer (SERDES) circuits, MGTs, and the like.

Though aspects and features may in some cases be described in individual figures, it will be appreciated that features from one figure can be combined with features of another figure even though the combination is not explicitly shown or explicitly described as a combination.

The circuits are thought to be applicable to a variety of physically unclonable functions. Other aspects and features will be apparent to those skilled in the art from consideration of the specification. The circuitry can be implemented as by application specific integrated circuits (ASIC), or as a logic on a programmable logic device. It is intended that the specification and drawings be considered as examples only, with a true scope of the invention being indicated by the following claims.

What is claimed is:

1. A circuit arrangement comprising:

a physically unclonable function (PUF) entropy source that includes first passive circuit elements and first active circuit elements;

a first die having one or more metal layers and an active layer, wherein the first passive circuit elements are disposed in the one or more metal layers; and a second die having one or more metal layers and an active layer, wherein the first active circuit elements are coupled to the first passive circuit elements and are disposed in the active layer of the second die, and the first die and the second die are in a stacked structure having the one or more metal layers of the first die disposed between the active layer of the first die and the active layer of the second die.

2. The circuit arrangement of claim 1, wherein the active layer of the second die is disposed between the one or more metal layers of the second die and the one or more metal layers of the first die.

3. The circuit arrangement of claim 1, wherein the PUF entropy source includes second passive circuit elements disposed in the one or more metal layers of the second die and coupled to the first active circuit elements.

4. The circuit arrangement of claim 3, further comprising a third die having an active layer and one or more metal layers, wherein the third die is arranged in the stacked structure and is electrically coupled to the first die and to the second die.

5. The circuit arrangement of claim 1, further comprising a third die having an active layer and one or more metal layers, wherein the third die is arranged in the stacked structure, and the PUF entropy source includes second passive circuit elements disposed in the one or more metal layers of the third die and coupled to the first active circuit elements of the PUF entropy source.

6. The circuit arrangement of claim 5, wherein the PUF entropy source includes third passive circuit elements disposed in the one or more metal layers of the second die and coupled to the first active circuit elements of the PUF entropy source.

7. The circuit arrangement of claim 1, further comprising a third die having an active layer and one or more metal layers, wherein:

the third die is arranged in the stacked structure;

the PUF entropy source includes second passive circuit elements, second active circuit elements, and third passive circuit elements;

the second passive circuit elements are disposed in the one or metal layers of the second die and are coupled to the first active circuit elements;

the second active circuit elements are disposed in the active layer of the third die and are coupled to the first active circuit elements; and the third passive circuit elements are disposed in the one or more metal layers of the third die and are coupled to the second active circuit elements.

8. The circuit arrangement of claim 1, wherein the first passive circuit elements include one or more capacitors.

9. The circuit arrangement of claim 8, wherein the one or more capacitors are metal-oxide-metal capacitors.

10. The circuit arrangement of claim 9, wherein the one or more capacitors are finger capacitors.

11. The circuit arrangement of claim 1, wherein the first passive circuit elements include one or more resistors.

12. The circuit arrangement of claim 1, wherein the PUF entropy source includes a plurality of ring oscillators implemented by the first active elements.

13. The circuit arrangement of claim 12, wherein the first passive circuit elements are coupled to nodes between stages of the plurality of ring oscillators.

14. The circuit arrangement of claim 13, the PUF entropy source includes second passive circuit elements disposed in the one or more metal layers of the second die and coupled to nodes between the stages of the plurality of ring oscillators.

15. A circuit arrangement comprising:

a connection structure;

a first die stacked on a first side of the connection structure and having one or more metal layers that include passive circuit elements of a physically unclonable function (PUF) entropy source; and a second die stacked below a second side of the connection structure and having an active layer and active circuit elements of the PUF entropy source coupled to the passive circuit elements through the connection structure.

16. The circuit arrangement of claim 15, wherein:

the first die includes an active layer;

the second die includes one or more metal layers; and a stacked arrangement of the first die, connection structure, and second die has the one or more metal layers of the first die disposed between the active layer of the first die and the active layer of the second die, and the active layer of the second die is disposed between the one or more metal layers of the first die and the one or more metal layers of the second die.

17. The circuit arrangement of claim 16, wherein the active circuit elements are configured as a plurality of ring oscillators, and the passive circuit elements include a plurality of capacitors.

18. The circuit arrangement of claim 17, wherein the passive circuit elements are coupled to nodes between stages of the plurality of ring oscillators.

19. The circuit arrangement of claim 18, wherein the second die includes a plurality of passive circuit elements coupled to the active circuit elements and disposed in the one or more metal layers of the second die.

20. The circuit arrangement of claim 16, wherein the active circuit elements are configured as a plurality of ring oscillators, and the passive circuit elements include a plurality of resistors.

* * * * *